(12) United States Patent
Borzabadi et al.

(10) Patent No.: US 7,983,046 B1
(45) Date of Patent: Jul. 19, 2011

(54) ELECTRONIC CONTROL MODULE AND ENCLOSED POWER MODULE

(75) Inventors: Hamid R. Borzabadi, Noblesville, IN (US); Ronald D. Wilcox, Lapeer, MI (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 12/709,659

(22) Filed: Feb. 22, 2010

(51) Int. Cl.
H05K 7/20 (2006.01)
(52) U.S. Cl. .............. 361/714; 361/709; 361/679.46; 361/715; 361/719; 165/80.3; 165/104.33; 165/185; 174/16.3; 174/252
(58) Field of Classification Search .......... 361/679.46, 361/679.54, 704, 707–710, 712–724; 165/80.2, 165/80.3, 103.33, 104.34, 185; 174/16.3, 174/252, 52.01; 257/713, 714, 718, 719, 257/721; 307/147; 363/143, 144
See application file for complete search history.

(56) References Cited

U.S. PATENT DOCUMENTS

| | | | |
|---|---|---|---|
| 4,219,172 A | | 8/1980 | Murayama |
| 4,769,557 A | * | 9/1988 | Houf et al. ............... 307/147 |
| 4,953,061 A | | 8/1990 | Nitkiewicz |
| 5,920,119 A | * | 7/1999 | Tamba et al. ............ 257/718 |
| 6,881,077 B2 | * | 4/2005 | Throum .................. 439/76.1 |
| 6,972,959 B2 | * | 12/2005 | Asai et al. ............... 361/719 |
| 6,984,796 B2 | | 1/2006 | Blossfeld |
| 7,120,024 B2 | * | 10/2006 | Watanabe et al. ....... 361/704 |
| 7,154,753 B2 | * | 12/2006 | Kobayashi ............... 361/715 |
| 7,352,585 B2 | * | 4/2008 | Mandel et al. .......... 361/714 |
| 7,417,861 B2 | * | 8/2008 | Kikuchi et al. .......... 361/718 |
| 7,643,297 B2 | * | 1/2010 | Tominaga et al. ....... 361/704 |
| 7,899,602 B2 | * | 3/2011 | Yoshinari et al. ....... 701/104 |
| 2005/0093181 A1 | * | 5/2005 | Brandenburg et al. ... 257/796 |
| 2008/0291653 A1 | | 11/2008 | Sailor et al. |

* cited by examiner

Primary Examiner — Michael V Datskovskiy
(74) Attorney, Agent, or Firm — Jimmy L. Funke

(57) ABSTRACT

Power electronic devices of an electronic control module are mounted in a power module disposed between the control module circuit board and an interior face of the control module case, with a prescribed separation distance between the circuit board and a housing of the power module. The power electronic devices are mounted on an inboard face of a power module substrate, and a heatsink thermally coupled to the opposite face of the substrate is fastened to an interior surface of the control module case. The substrate and heatsink are mounted in the power module housing, and the power electronic devices are electrically coupled to the circuit board by a set of compliant terminals that protrude from the inboard face of the power module housing. The terminals extend into plated holes in the circuit board, and have shoulders that limit their depth of insertion to establish the prescribed separation distance between the circuit board and the power module housing.

10 Claims, 4 Drawing Sheets

ELECTRONIC CONTROL MODULE AND ENCLOSED POWER MODULE

TECHNICAL FIELD

The present invention relates to an electronic control module that encases heat-generating power electronic devices, and more particularly to a packaging arrangement for the power electronic devices.

BACKGROUND OF THE INVENTION

Electronic control modules frequently include heat-generating power electronic devices such as transistors for controlling the current supplied to an external load, and various packaging arrangements have been devised for mounting the power electronic devices in a way that effectively dissipates the heat generated due to their switching and conduction losses. The packaging arrangements are influenced by other considerations as well, such maximizing circuit board utilization within the control module and providing adequate thermal isolation between the power electronic devices and other control module components that cannot withstand high temperatures. These design considerations tend to be incompatible to some extent, and the usual packaging arrangements at best represent a compromise solution. Accordingly, what is desired is a more effective and space-efficient packaging arrangement for the power electronic devices of an electronic control module.

SUMMARY OF THE INVENTION

The present invention provides an improved packaging arrangement for the power electronic devices of an electronic control module. The control module includes a thermally-conductive case that encloses a circuit board, and the power electronic devices are mounted in a power module disposed between the circuit board and an interior face of the case, with a prescribed separation distance between the circuit board and a housing of the power module.

The power module includes a thermally-conductive substrate and heatsink mounted together in a molded housing and oriented parallel to the circuit board. The heatsink is thermally coupled and mechanically affixed to the interior surface of the case, and the power electronic devices are mounted on an inboard face of the substrate so that heat generated by the power electronic devices is primarily conducted to the case through the substrate and heatsink. The power electronic devices are electrically coupled to the circuit board by a set of compliant-pin terminals that protrude from an inboard face of the molded housing and extend into plated holes formed in the circuit board, and the terminals are provided with shoulders that limit their depth of insertion into the circuit board to establish the prescribed separation distance between the circuit board and the housing of the power module. The circuit board area immediately inboard of the power module is available for mounting other devices and components of the control module, including those that cannot withstand the high temperatures produced by the power electronic devices.

DESCRIPTION OF THE PREFERRED EMBODIMENT

Figure 1:
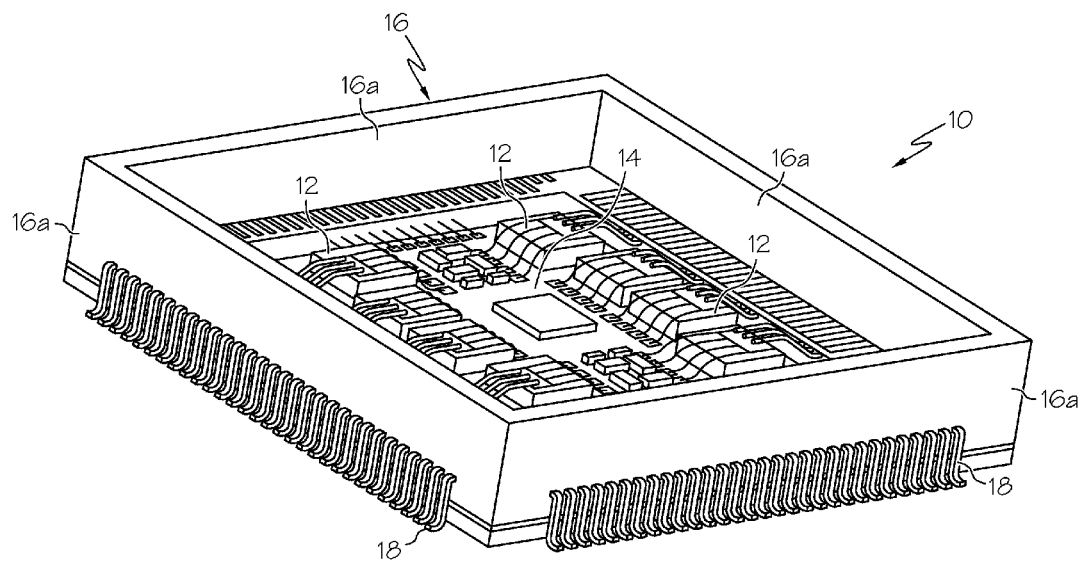
FIG. 1 is an isometric view of a prior art surface-mount power module.

As mentioned above, the present invention is directed to an improved packaging arrangement for the power electronic devices of an electronic control module. In general, the control module must be designed both to dissipate heat generated by power electronic devices and to provide adequate thermal isolation for the module components that cannot withstand the heat from the power electronic devices. Referring to FIG. 1, a current trend for such applications is to up-integrate the power electronic devices into a surface-mount power module 10 that is mounted on and soldered to the circuit board of the control module (not shown). In the illustrated surface-mount power module 10, power electronic devices 12 are mounted on a ceramic substrate 14 within a molded housing 16, and are wire-bonded to surface-mount terminals 18 that protrude through the sidewalls 16a of housing 16. The substrate 14 or a heatsink (not shown) underlying the substrate 14 is thermally coupled to the circuit board of the control module by solder or other thermally-conductive interface material to dissipate heat into the circuit board, and eventually into the case of the control module. In some cases, a thermally-conductive material is also dispensed onto the outboard face of the power module 10 to transfer some of the heat directly from the power module 10 to the control module case. While the power module 10 is compact and cost-effective, its usefulness is limited because it is difficult to remove sufficient heat from the power electronic devices 12, and a significant area of control module's circuit board is unavailable for other components of the control module due to the placement of the power module 10 on the circuit board and the consequent heating of the circuit board.

Compared to the packaging arrangement illustrated in FIG. 1, the packaging arrangement of the present invention improves both heat transfer from the power module and space utilization of the control module circuit board. In general, this is achieved with a power module that is mounted directly on the control module case and electrically coupled to the control module circuit board with a set of compliant-pin terminals. The compliant-pin terminals allow solder-less attachment to the control module circuit board when the circuit board is assembled into the control module case, and establish a prescribed stand-off or separation distance between the power module housing and the control module circuit board. Direct-mounting the power module on the control module case significantly enhances heat transfer to the case, and the stand-off circuit board mount permits the placement of other devices and components on the circuit board immediately inboard of the power module, even those components that cannot withstand the high temperatures produced by the power electronic devices.

Figure 2:
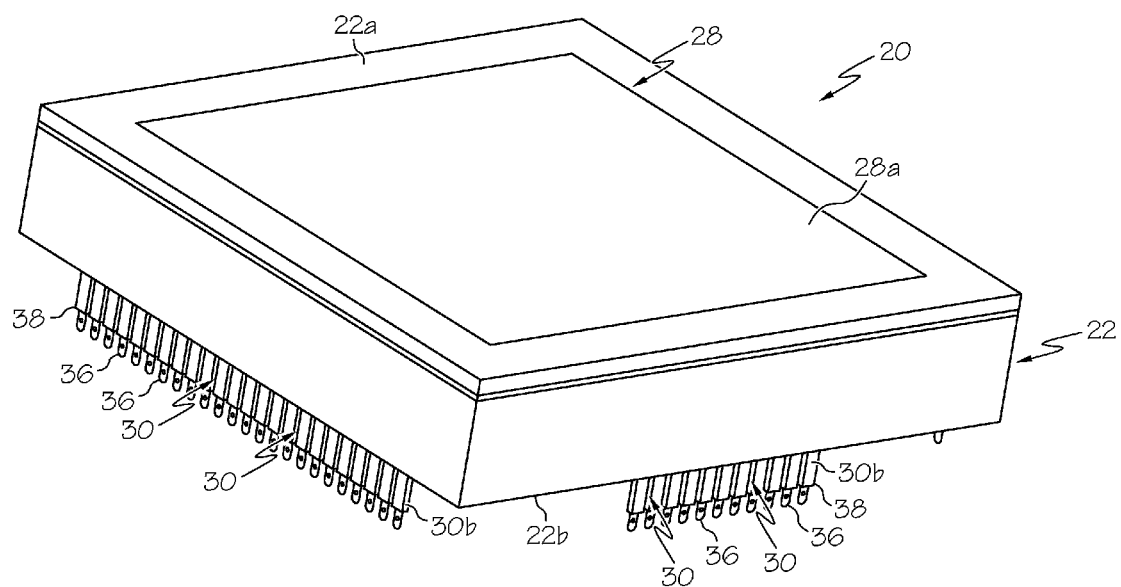
FIG. 2 is an isometric view of the compliant-pin power module of this invention.
Figure 3:
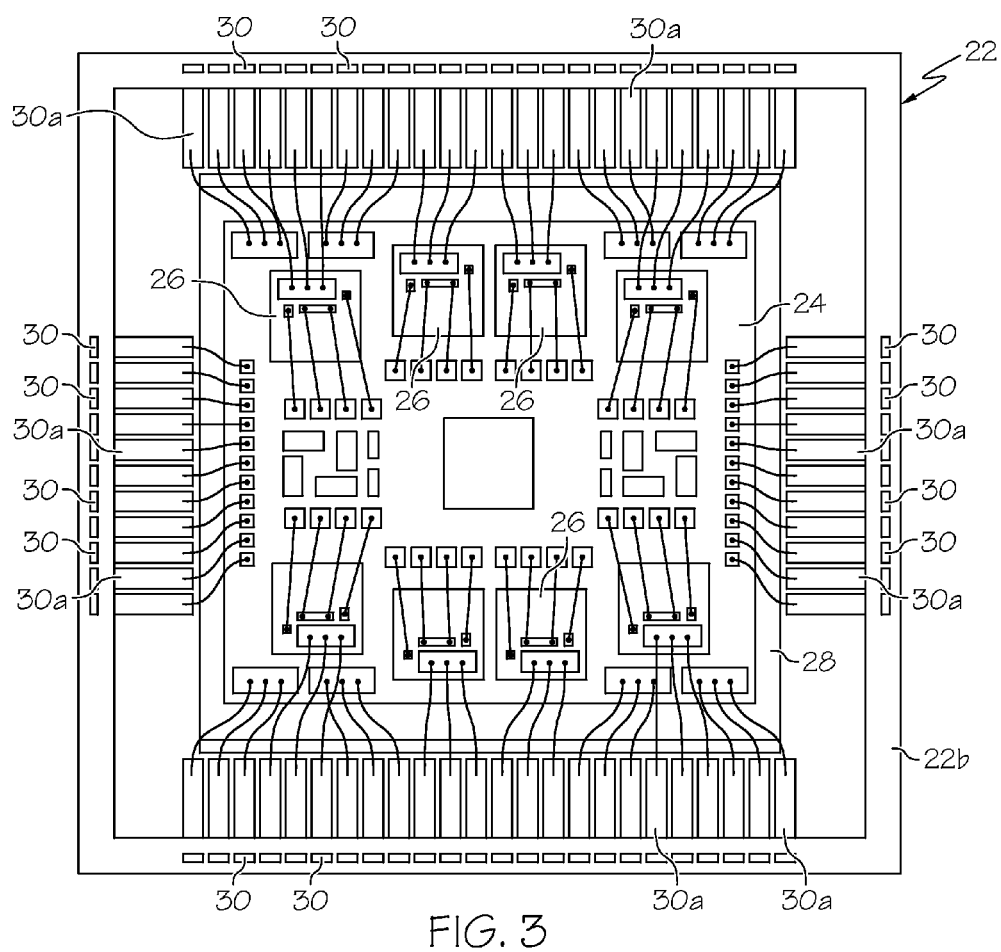
FIG. 3 is a bottom view of the compliant-pin power module of FIG. 2, with its cover and passivation material removed to expose its substrate and power electronic devices mounted on the substrate.
Figure 4:
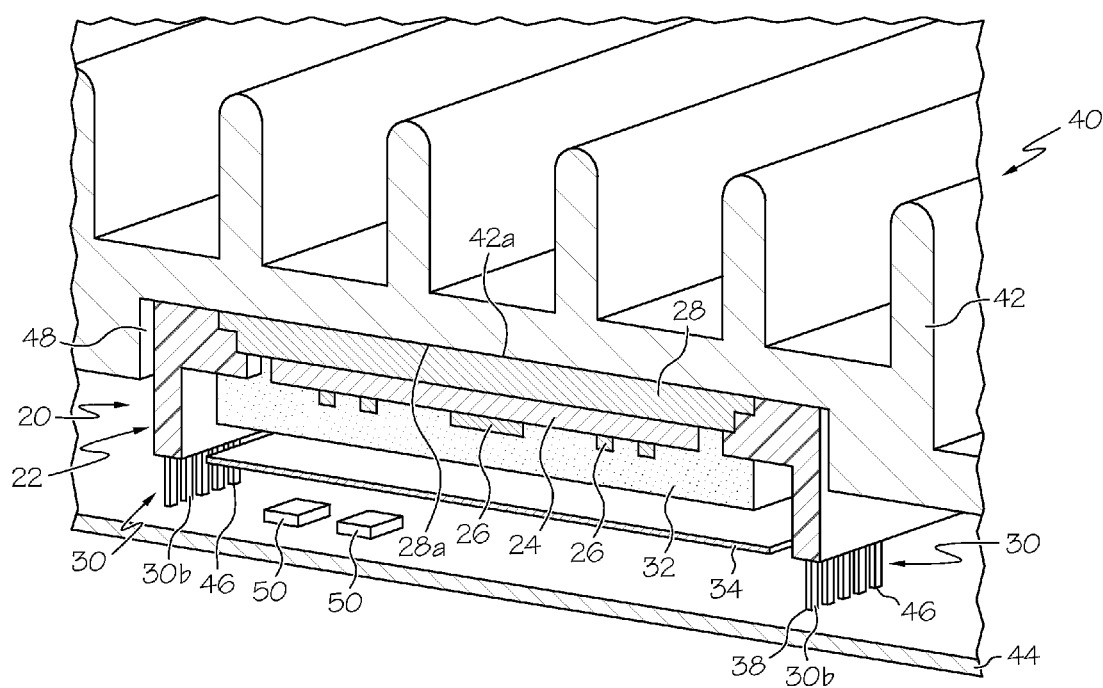
FIG. 4. is a cross-sectional isometric view of the power module of FIG. 2 as installed in an electronic control module.

FIGS. 2-4 illustrate the packaging arrangement of the present invention. FIGS. 2-3 depict an improved compliant-pin power module 20 by itself, and FIG. 4 depicts the compliant-pin power module 20 when installed in a control module 40. Referring to FIGS. 2-4, the power module 20 includes a molded housing 22, a ceramic or other thermally-conductive substrate 24 populated with power electronic devices 26, a heatsink 28, a set of compliant-pin terminals 30, and a passivation material 32 and cover 34. The un-populated side of substrate 24 is bonded or otherwise fastened to the heatsink 28, and insert-molded into the housing 22 along with the compliant-pin terminals 30 such that the heatsink 28 is exposed at the upper (outboard) face 22a of the molded housing 22, and the compliant-pin terminals 30 protrude from the lower (inboard) face 22b of housing 22. As seen in FIG. 3, the inboard ends 30a of the compliant-pin terminals 30 are exposed adjacent to the substrate 24, and the power electronic devices 26 on substrate 24 are electrically coupled to the terminal ends 30a by wire-bonding. The passivation material 32 provides a moisture-barrier for the power electronic devices 26 and wirebonds, and the cover 34 retains the passivation material 32. Finally, the terminal portions 30b that protrude from the lower (inboard) face 22b of housing 22 have compliant terminations (eye-of-needle, for example) 36 for solder-less attachment to the circuit board 44 of control module 40.

FIG. 4 depicts the relevant portions of the control module 40, including a finned thermally-conductive case 42 and a circuit board 44. As seen in FIG. 4, the power module 20 is directly fastened to an interior surface 42a of the control module case 42 such that the outboard face 28a of heatsink 28 is in direct thermal contact with the interior surface 42a. Once the power module 20 is fastened to the control module case 42, the circuit board 44 is positioned on the control module case 42 and pressed into place so that the compliant terminations 36 of compliant-pin terminals 30 extend into plated holes 46 formed in circuit board 44. The width dimensions of the protruding terminal portions 30b are substantially larger than the diameters of the circuit board openings 46, effectively forming shoulders 38 that engage the face of the circuit board 44 and thereby limit the depth of insertion of the compliant-pin terminals 30. The length dimensions of the protruding terminal portions 30b are such that when the terminal shoulders 38 engage the circuit board 44, there exists a prescribed stand-off or separation distance between circuit board 44 and the inboard face 22b of power module housing 22. As also noted in FIG. 4, the stand-off or separation distance between circuit board 44 and the inboard face 22b of power module housing 22 may be controlled by recessing the interior surface 42a of the control module case 42, as indicated by the reference numeral 48. In a preferred mechanization, the stand-off or separation distance may be in the range of 1 mm to 5 mm. And as mentioned above, the stand-off or separation distance allows the placement of other control module components 50 on circuit board 44 directly inboard of the power module 20 for improved space utilization of the circuit board 44. Of course, improving the space utilization allows more components to be mounted on the circuit board 44, or alternatively, the area of the circuit board 44 (and hence, the size of control module 40) may be reduced. Advantageously, the components 50 may be control ICs that interface with the power electronic devices 26 of power module 20, so that the signal paths between the control and power devices 50, 26 are very short for improved performance and reduced heat dissipation.

In summary, the packaging arrangement of the present invention substantially enhances both heat dissipation of power electronic devices 26 within a control module 40 and circuit board utilization within the control module 40. The compliant terminations 36 of the power module terminals 30 simplify assembly of the control module 40, and the relatively large size of the terminals 30 is much better suited for the current-carrying requirements of a power module 20 than the prior art surface-mount terminals 18. And unlike the prior art surface-mount terminals 18, the complaint-pin terminals 30 protrude from the inboard face 22b of the power module housing 22 to reduce the lateral exterior dimensions of the power module 22. Another beneficial aspect of the compliant-pin terminals 30 is that they dissipate a portion of the power module heat into the circuit board 44, though the heat is predominantly dissipated directly into the control module case 42 as described above.

While the present invention has been described with respect to the illustrated embodiment, it is recognized that numerous modifications and variations in addition to those mentioned herein will occur to those skilled in the art. Accordingly, it is intended that the invention not be limited to the disclosed embodiment, but that it have the full scope permitted by the language of the following claims.

The invention claimed is:

1. An electronic control module with enclosed power electronic devices, comprising:
    a thermally-conductive electronic control module case;
    a circuit board enclosed by said control module case;
    a thermally-conductive substrate oriented parallel to said circuit board and mounted in a molded housing disposed between said control module case and said circuit board, said substrate having an outboard surface facing said control module case and an inboard surface on which said power electronic devices are mounted;
    a heatsink mounted in said molded housing along with said substrate, said heatsink having an inboard face that is thermally coupled to the outboard face of said substrate, and an outboard face that is thermally coupled and mechanically affixed to an interior surface of said control module case; and
    a set of terminals protruding from an inboard face of said molded housing and extending into plated holes formed in said circuit board to electrically couple said power electronic devices to said circuit board, said terminals being provided with shoulders that limit their depth of insertion into said circuit board and establish a prescribed separation distance between said molded housing and said circuit board.

2. The electronic control module of claim 1, where:
    said terminals have compliant terminations that extend into the plated holes of said circuit board to provide solder-less electrical connections between said terminals and said circuit board.

3. The electronic control module of claim 1, further comprising:
    electronic components mounted on said circuit board directly inboard of said molded housing within the prescribed separation distance between said molded housing and said circuit board.

4. The electronic control module of claim 1, where:
    said substrate, said heatsink, and said terminals are insert molded in said molded housing.

5. An electronic control module with enclosed power electronic devices, comprising:
    a thermally-conductive electronic control module case;
    a circuit board enclosed by said case; and
    a power module including a housing that is separated from said circuit board by a prescribed separation distance, a heatsink fixed in the power module housing and mechanically fastened to an interior surface of said control module case, a thermally-conductive substrate fixed in the power module housing with an outboard surface thermally coupled to said heatsink and an inboard surface on which said power electronic devices are mounted, and a set of terminals protruding from an inboard face of the power module housing surrounding said substrate and extending into plated holes formed in said circuit board to electrically couple said power electronic devices to said circuit board.

6. The electronic control module of claim 5, where:
said terminals have shoulders that limit their depth of insertion into said circuit board to establish said prescribed separation distance between the power module housing and said circuit board.

7. The electronic control module of claim 5, further comprising:
electronic components mounted on said circuit board directly inboard of said power module housing within the prescribed separation distance between said power module housing and said circuit board.

8. The electronic control module of claim 5, where:
said terminals have compliant terminations that extend into the plated holes of said circuit board to provide solderless electrical connections between said terminals and said circuit board.

9. The electronic control module of claim 5, where:
said substrate, said heatsink, and said terminals are insert molded in said power module housing.

10. The electronic control module of claim 5, where:
said prescribed separation distance is in the range of 1 mm to 5 mm.

* * * * *